United States Patent
Aiba

(10) Patent No.: US 8,431,233 B2
(45) Date of Patent: *Apr. 30, 2013

(54) GAS-BARRIER FILM, DEVICE AND OPTICAL COMPONENT COMPRISING SAME, AND METHOD FOR PRODUCING GAS-BARRIER FILM

(75) Inventor: Satoshi Aiba, Kanagawa (JP)

(73) Assignee: FujiFilm Corporation, Tokyo (JP)

( * ) Notice: Subject to any disclaimer, the term of this patent is extended or adjusted under 35 U.S.C. 154(b) by 606 days.

This patent is subject to a terminal disclaimer.

(21) Appl. No.: 12/343,895

(22) Filed: Dec. 24, 2008

(65) Prior Publication Data

US 2009/0176116 A1 Jul. 9, 2009

(30) Foreign Application Priority Data

Dec. 27, 2007 (JP) ................. 2007-337413
Feb. 29, 2008 (JP) ................. 2008-049576

(51) Int. Cl.
*B32B 9/04* (2006.01)
*B32B 27/00* (2006.01)
*B32B 9/00* (2006.01)
*C23C 16/00* (2006.01)
*B05D 3/00* (2006.01)

(52) U.S. Cl.
USPC ..... 428/500; 428/411.1; 428/688; 427/255.6; 427/255.7; 427/294

(58) Field of Classification Search ............... 428/411.1, 428/500, 688; 427/255.6, 255.7, 294
See application file for complete search history.

(56) References Cited

U.S. PATENT DOCUMENTS

2007/0231592 A1* 10/2007 Agata ................. 428/522

FOREIGN PATENT DOCUMENTS

| JP | 2003-336820 A | 11/2003 |
| JP | 2005-254795 A | 9/2005 |
| JP | 2007-290369 A | 11/2007 |

OTHER PUBLICATIONS

Japanese Office Action (with English translation) dated May 11, 2010 issued in corresponding Japanese Application No. JP 2008 049576.
U.S. Office Action for U.S. Appl. No. 12/343,911 dated Aug. 12, 2011.

* cited by examiner

*Primary Examiner* — Alicia Chevalier
*Assistant Examiner* — Chinessa Adkins
(74) *Attorney, Agent, or Firm* — Birch, Stewart, Kolasch & Birch, LLP

(57) ABSTRACT

A gas-barrier film comprising an organic layer and an inorganic layer on a substrate film, wherein the organic layer is formed by vacuum vapor deposition of a composition containing a radical-polymerizable monomer and a polymerization initiator, followed by curing the composition, the polymerization initiator being liquid at 30° C. under one atmosphere and/or having a melting point of not higher than 30° C. The gas-barrier film has a low water vapor permeability.

25 Claims, No Drawings

GAS-BARRIER FILM, DEVICE AND OPTICAL COMPONENT COMPRISING SAME, AND METHOD FOR PRODUCING GAS-BARRIER FILM

BACKGROUND OF THE INVENTION

1. Field of the Invention

The present invention relates to a gas-barrier film, and a device and an optical component comprising it. The invention also relates to a method for producing a gas-barrier film.

2. Description of the Related Art

Heretofore, widely investigated is a gas-barrier film comprising an organic layer and an inorganic layer, which is a gas-barrier film where the inorganic layer is formed by vacuum vapor deposition and the acrylic monomer is polymerized.

For example, JP-A 10-278167 discloses a gas-barrier film characterized in that an acrylic resin layer formed according to a vacuum UV curing method and a thin film of a metal or metal compound formed by vapor deposition are laminated in order on one surface of a resin film. In JP-A 10-278167, the polymerization initiator used is a benzophenone-based polymerization initiator which is powdery at room temperature.

JP-A 2003-335820 discloses a gas-barrier plastic film produced by alternately laminating one or more layers of an organic layer and an inorganic layer on at least one surface of a substrate comprising a polymer material, in which the organic layer is formed by vacuum vapor deposition of a specific acrylic monomer-based resin for vapor deposition film followed by crosslinking it with an active energy ray. In JP-A 2003-335820, the polymerization initiator used is a non-benzophenone-based polymerization initiator which is powdery at room temperature.

However, as a result of the present inventors' investigations, it has been known that, in the above-mentioned JP-A 10-278167 or JP-A 2003-335820, when the organic layer is formed by vacuum vapor deposition of an acrylic monomer, then the layer is uneven in curing of the acrylic monomer, and a stable organic layer is difficult to form since a large amount of an unreacted acrylic monomer remains therein. In addition, there occurs other problems in that the remaining acrylic monomer and the remaining polymerization initiator may be released to the adjacent layer such as an inorganic layer, and the adjacent layer may be defoamed and broken thereby lowering the barrier capability of the film.

SUMMARY OF THE INVENTION

The present invention is to solve these problems, and its object is to provide a gas-barrier film comprising an organic layer formed by vacuum vapor deposition of a radical-polymerizable monomer, in which the organic layer is formed stably, and to provide a method for producing the film.

The present inventors have assiduously studied the above-mentioned problems and, as a result, have found that, since the polymerization initiator is powdery, it is readily solidified by itself in vacuum vapor deposition of the polymerizable monomer therefore giving unevenness in curing. In addition, as a result thereof, a large amount of the polymerization initiator is necessary and the polymerizable monomer is apt to remain in the organic layer. Further, the inventors have found that the excessive polymerization initiator and polymerizable monomer are released to the adjacent layer such as an inorganic layer, therefore causing damage to the adjacent layer and lowering the barrier capability of the film. Given that situation, the inventors have assiduously studied and, as a result, have found that, when a liquid polymerization initiator is used, then the above-mentioned problems can be solved. In this technical field, heretofore it has been considered that a solid polymerization initiator is favorable since it has a high melting point and therefore the initiator hardly evaporates in organic film formation. Surprisingly, the inventors, herein providing the present invention, have found that the above-mentioned prior-art problems can be solved by employing the revolutionary idea opposite to the prior art.

Concretely, the invention solving the above-mentioned problems includes the following:

(1) A gas-barrier film comprising at least one organic layer and at least one inorganic layer on a substrate film, wherein the organic layer is formed by vacuum vapor deposition of a composition containing a radical-polymerizable monomer and a polymerization initiator that is liquid at 30° C. under one atmosphere, followed by curing the composition.

(2) A gas-barrier film comprising at least one organic layer and at least one inorganic layer on a substrate film, wherein the organic layer is formed by vacuum vapor deposition of a composition containing a radical-polymerizable monomer and a polymerization initiator having a melting point of not higher than 30° C., followed by curing the composition.

(3) The gas-barrier film of (1) or (2), wherein the molecular weight of the polymerization initiator is at least 170.

(4) The gas-barrier film of any one of (1) to (3), wherein the composition contains the polymerization initiator in a ratio of at most 2% by weight.

(5) The gas-barrier film of any one of (1) to (4), wherein the polymerization initiator contains at least one compound of the following formula (1):

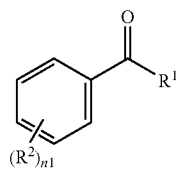

(1)

wherein $R^1$ represents a substituted or unsubstituted alkyl group having from 1 to 18 carbon atoms, a substituted or unsubstituted aryl group having from 6 to 18 carbon atoms, a carbonyl group, or a substituent comprising any two or more such groups bonding to each other; $R^2$ represents a substituted or unsubstituted alkyl group having from 1 to 18 carbon atoms, a substituted or unsubstituted aryl group having from 6 to 18 carbon atoms, an amino group, an alkoxy group, an acyl group, an alkoxycarbonyl group, an alkylthio group, an arylthio group, a hydroxy group, a halogen atom, or a cyano group; n1 indicates an integer of from 0 to 5; when n1 is 2 or more, $R^2$'s may be the same or different.

(6) The gas-barrier film of anyone of (1) to (4), wherein the polymerization initiator contains at least one compound of the following formula (2):

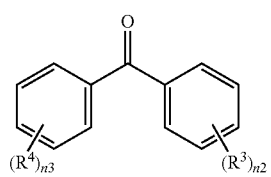

(2)

wherein $R^3$ represents a substituted or unsubstituted alkyl group having from 1 to 18 carbon atoms, a substituted or unsubstituted aryl group having from 6 to 18 carbon atoms, an amino group, an alkoxy group, an acyl group, an alkoxycarbonyl group, an alkylthio group, an arylthio group, a hydroxy group, a halogen atom, or a cyano group; $R^4$ represents a substituted or unsubstituted alkyl group having from 1 to 18 carbon atoms, a substituted or unsubstituted aryl group having from 6 to 18 carbon atoms, an amino group, an alkoxy group, an acyl group, an alkoxycarbonyl group, an alkylthio group, an arylthio group, a hydroxy group, a halogen atom, or a cyano group; n2 and n3 each indicate an integer of from 0 to 5, but both n2 and n3 are not 0 at the same time; when n2 is 2 or more, $R^3$'s may be the same or different; and when n3 is 2 or more, $R^4$'s may be the same or different.

(7) The gas-barrier film of anyone of (1) to (6), wherein the organic layer is formed by flash vapor deposition.

(8) The gas-barrier film of any one of (1) to (7), wherein the radical-polymerizable monomer constituting the organic layer is at least one selected from compounds of the following formula (4):

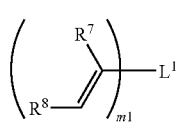

(4)

wherein $R^7$ represents a hydrogen atom or a methyl group; $R^8$ represents a hydrogen atom; $L^1$ represents a substituted or unsubstituted aliphatic hydrocarbon group having from 1 to 18 carbon atoms, a substituted or unsubstituted aromatic hydrocarbon group having from 6 to 18 carbon atoms, an ether group, an imino group, a carbonyl group, or a monovalent or polyvalent linking group comprising any of these groups bonding to each other in series; m1 indicates an integer of from 1 to 6; when m1 is 2 or more, $R^7$'s and $R^8$'s each may be the same or different.

(9) The gas-barrier film of anyone of (1) to (7), wherein the radical-polymerizable monomer constituting the organic layer is at least one selected from compounds of the following formula (5):

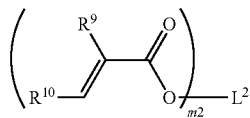

(5)

wherein $R^9$ represents a hydrogen atom or a methyl group; $R^{10}$ represents a hydrogen atom; $L^2$ represents a substituted or unsubstituted aliphatic hydrocarbon group having from 1 to 18 carbon atoms, a substituted or unsubstituted aromatic hydrocarbon group having from 6 to 18 carbon atoms, an ether group, an imino group, a carbonyl group, or a monovalent or polyvalent linking group comprising any of these groups bonding to each other in series; m2 indicates an integer of from 1 to 6; when m2 is 2 or more, $R^9$'s and $R^{10}$'s each may be the same or different.

(10) Method for producing a gas-barrier film comprising at least one organic layer and at least one inorganic layer on a substrate film, wherein the method comprises conducting vacuum vapor deposition of a composition containing a radical-polymerizable monomer and a polymerization initiator that is liquid at 30° C. under one atmosphere, and then curing the composition to form the organic layer.

(11) Method for producing a gas-barrier film comprising at least one organic layer and at least one inorganic layer on a substrate film, wherein the method comprises conducting vacuum vapor deposition of a composition containing a radical-polymerizable monomer and a polymerization initiator having a melting point of not higher than 30° C., and then curing the composition to form the organic layer.

(12) The method for producing a gas-barrier film of (10) or (11), wherein a polymerization initiator having a molecular weight of at least 170 is used.

(13) The method for producing a gas-barrier film of any one of (10) to (12), wherein the composition contains the polymerization initiator in a ratio of at most 2% by weight.

(14) The method for producing a gas-barrier film of any one of (10) to (13), wherein a polymerization initiator containing at least one compound of the following formula (1) is used:

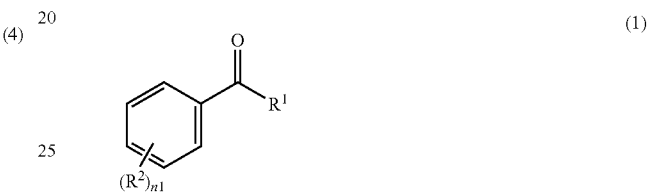

(1)

wherein $R^1$ represents a substituted or unsubstituted alkyl group having from 1 to 18 carbon atoms, a substituted or unsubstituted aryl group having from 6 to 18 carbon atoms, a carbonyl group, or a substituent comprising any two or more such groups bonding to each other; $R^2$ represents a substituted or unsubstituted alkyl group having from 1 to 18 carbon atoms, a substituted or unsubstituted aryl group having from 6 to 18 carbon atoms, an amino group, an alkoxy group, an acyl group, an alkoxycarbonyl group, an alkylthio group, an arylthio group, a hydroxy group, a halogen atom, or a cyano group; n1 indicates an integer of from 0 to 5; when n1 is 2 or more, $R^2$'s may be the same or different.

(15) The method for producing a gas-barrier film of any one of (10) to (13), wherein a polymerization initiator containing at least one compound of the following formula (2) is used:

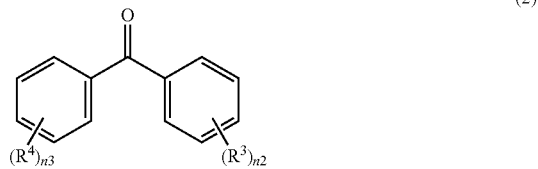

(2)

wherein $R^3$ represents a substituted or unsubstituted alkyl group having from 1 to 18 carbon atoms, a substituted or unsubstituted aryl group having from 6 to 18 carbon atoms, an amino group, an alkoxy group, an acyl group, an alkoxycarbonyl group, an alkylthio group, an arylthio group, a hydroxy group, a halogen atom, or a cyano group; $R^4$ represents a substituted or unsubstituted alkyl group having from 1 to 18 carbon atoms, a substituted or unsubstituted aryl group having from 6 to 18 carbon atoms, an amino group, an alkoxy group, an acyl group, an alkoxycarbonyl group, an alkylthio group, an arylthio group, a hydroxy group, a halogen atom, or a cyano group; n2 and n3 each indicate an integer of from 0 to 5, but both n2 and n3 are not 0 at the same time; when n2 is 2 or more, $R^3$'s may be the same or different; and when n3 is 2 or more, $R^4$'s may be the same or different.

(16) The method for producing a gas-barrier film of any one of (10) to (15), wherein the organic layer is formed by flash vapor deposition.

(17) The method for producing a gas-barrier film of any one of (10) to (16), wherein the radical-polymerizable monomer constituting the organic layer is at least one selected from compounds of the following formula (4):

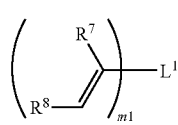

(4)

wherein $R^7$ represents a hydrogen atom or a methyl group; $R^8$ represents a hydrogen atom; $L^1$ represents a substituted or unsubstituted aliphatic hydrocarbon group having from 1 to 18 carbon atoms, a substituted or unsubstituted aromatic hydrocarbon group having from 6 to 18 carbon atoms, an ether group, an imino group, a carbonyl group, or a monovalent or polyvalent linking group comprising any of these groups bonding to each other in series; m1 indicates an integer of from 1 to 6; when m1 is 2 or more, $R^7$'s and $R^8$'s each may be the same or different.

(18) The method for producing a gas-barrier film of any one of (10) to (16), wherein the radical-polymerizable monomer constituting the organic layer is at least one selected from compounds of the following formula (5):

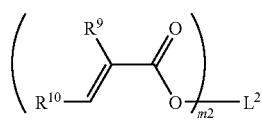

(5)

wherein $R^9$ represents a hydrogen atom or a methyl group; $R^{10}$ represents a hydrogen atom; $L^2$ represents a substituted or unsubstituted aliphatic hydrocarbon group having from 1 to 18 carbon atoms, a substituted or unsubstituted aromatic hydrocarbon group having from 6 to 18 carbon atoms, an ether group, an imino group, a carbonyl group, or a monovalent or polyvalent linking group comprising any of these groups bonding to each other in series; m2 indicates an integer of from 1 to 6; when m2 is 2 or more, $R^9$'s and $R^{10}$'s each may be the same or different.

(19) A gas-barrier film produced according to the production method of any one of (10) to (18).

(20) A device in which a gas-barrier film of any one of (1) to (9) and (19) is used as a sealant film.

(21) A device in which a gas-barrier film of any one of (1) to (9) and (19) is used as a substrate.

(22) The device of (20) or (21), which is an electronic device.

(23) The device of (20) or (21), which is an organic EL device.

(24) An optical component comprising a gas-barrier film of any one of (1) to (9) and (19) as the substrate thereof.

The invention has made it possible to provide a gas-barrier film having excellent barrier capability in which the organic layer is formed stably.

BEST MODE FOR CARRYING OUT THE INVENTION

The gas-barrier film and its production method, and the device such as an organic EL device comprising the gas-barrier film of the invention are described in detail hereinunder. The description of the constitutive elements of the invention given hereinunder is for some typical embodiments of the invention, to which, however, the invention should not be limited. In this description, the numerical range expressed by the wording "a number to another number" means the range that falls between the former number indicating the lowermost limit of the range and the latter number indicating the uppermost limit thereof.

<Gas-Barrier Film>

The gas-barrier film of the invention has a barrier layer comprising at lest one organic layer and at least one inorganic layer, on a substrate film, and the organic layer satisfies at lease any one requirement of the following (1) ad (2):

(1) The organic layer is formed by vacuum vapor deposition of a composition containing a radical-polymerizable monomer and a polymerization initiator liquid at 30° C. under one atmosphere, followed by curing it.

(2) The organic layer is formed by vacuum vapor deposition of a composition containing a radical-polymerizable monomer and a polymerization initiator having a melting point of not higher than 30° C., followed by curing it.

The gas-barrier film of the invention may contain an organic region and an inorganic region in which the boundary of the organic layer and the inorganic layer is indefinite. For simplifying the description hereinunder, the organic layer and the organic region are referred to as "organic layer"; and the inorganic layer and the inorganic region are referred to as "inorganic layer". In case where the barrier layer comprises plural organic layers and inorganic layers, in general, it is desirable that the organic layers and the inorganic layers are alternately laminated to constitute the barrier layer.

In case where the barrier layer comprises a constitution of an organic region and an inorganic region, the regions may form a gradation material layer where the regions continuously change in the thickness direction of the layer. As examples of the gradation material, there are mentioned materials described in Kim et al's report, Journal of Vacuum Science and Technology A, Vol. 23 pp. 971-977 (2005 American Vacuum Society); and gradation layers of an organic layer and an inorganic layer laminated with no boundary therebetween as in US Laid-Open 2004-46497.

The gas-barrier film of the invention may have any other functional layer than the organic layer and the inorganic layer. As examples of the functional layer, preferred are those to be mentioned hereinunder in the section of substrate films.

(Substrate Film)

The substrate film for use in the gas-barrier film of the invention is not specifically defined in point of the material and the thickness thereof, so far as it can hold the constitutive layers such as the organic layer and the inorganic layer, and the substrate film may be suitably selected in accordance with the purpose of its use.

In case where the gas-barrier film of the invention is used as a substrate of a device such as an organic EL device to be mentioned hereinunder, it is desirable that the substrate film is a heat-resistant plastic film. Concretely, the film is preferably formed of a heat-resistant transparent material having a glass transition temperature (Tg) of not lower than 100° C. and/or a linear thermal expansion coefficient of at least 40 ppm/° C. Tg and the linear expansion coefficient may be controlled by the additives to the material. The thermoplastic resin of the type includes, for example, polyethylene naphthalate (PEN: 120° C.), polycarbonate (PC: 140° C.), alicyclic polyolefin (e.g., Nippon Zeon's Zeonoa 1600: 160° C.), polyarylate (PAr: 210° C.), polyether sulfone (PES: 220° C.), polysulfone (PSF: 190° C.), cycloolefin copolymer (COC, compound described in JP-A 2001-150584: 162° C.), polyimide (e.g., Mitsubishi Gas Chemical's Neoprim: 260° C.), fluorene ring-modified polycarbonate (BCF-PC, compound described in JP-A 2000-227603: 225° C.), alicyclic-modified polycarbonate (IP-PC, compound described in JP-A 2000-227603: 205° C.), acryloyl compound (compound described in JP-A 2002-80616: 300° C. or more) (the parenthesized data are Tg). In particular, for high transparency, use of alicyclic polyolefin and the like is preferred.

In case where the gas-barrier film of the invention is combined with a polarizer for its use, it is desirable that the barrier layer side (on which the laminate containing at least one inorganic layer and at least one organic layer is formed) of the gas-barrier film is made to face the inside of the cell and the film is disposed in the innermost position (adjacent to the device). In this, since the gas-barrier film is disposed nearer to the cell than to the polarizer, the retardation value of the gas-barrier film is important. In use of the gas-barrier film in this embodiment, preferably, the gas-barrier film comprises a substrate film having a retardation of at most 10 nm and this is laminated with a circularly polarizing plate (¼ wavelength plate+(½ wavelength plate)+linear polarizing plate), or the gas barrier film comprises a substrate film having a retardation of from 100 nm to 180 nm and usable as a ¼ wavelength plate and this is laminated with a linear polarizing plate.

The substrate film having a retardation of at most 10 nm includes cellulose triacetate (FUJIFILM's Fujitac), polycarbonate (Teijin Chemical's Pureace, Kaneka's Elmec), cycloolefin polymer (JSR's Arton, Nippon Zeon's Zeonoa), cycloolefin copolymer (Mitsui Chemical's Apel (pellets), Polyplastic's Topas (pellets)), polyarylate (Unitika's U100 (pellets)), transparent polyimide (Mitsubishi Gas Chemical's Neoprim), etc.

As the ¼ wavelength plate, usable is a film prepared by suitably stretching the above-mentioned film so as to have a desired retardation value.

Since the gas-barrier film of the invention is usable in devices such as organic EL devices, the plastic film is transparent, or that is, its light transmittance is generally at least 80%, preferably at least 85%, more preferably at least 90%. The light transmittance may be measured according to the method described in JIS-K7105. Concretely, using an integrating sphere-type light transmittance meter, a whole light transmittance and a quantity of scattered light are measured, and the diffusive transmittance is subtracted from the whole transmittance to obtain the intended light transmittance of the sample.

Even when the gas-barrier film of the invention is used in displays, it does not always require transparency in a case where it is not disposed on the viewers' side. Accordingly in such a case, a nontransparent material may be used for the plastic film. The nontransparent material includes, for example, polyimide, polyacrylonitrile, known liquid-crystal polymer.

Not specifically defined, the thickness of the plastic film for use in the gas-barrier film of the invention may be suitably selected depending on its use. Typically, the thickness may be from 1 to 800 μm, preferably from 10 to 200 μm. The plastic film may have a functional layer such as a transparent conductive layer, a primer layer, etc. The functional layer is described in detail in JP-A 2006-289627, paragraphs [0036] to [0038]. Examples of other functional layers than those are a mat agent layer, a protective layer, an antistatic layer, a planarizing layer, an adhesiveness improving layer, a light shielding layer, an antireflection layer, a hard coat layer, a stress relaxing layer, an antifogging layer, an anti-soiling layer, a printable layer, an easily-adhesive layer, etc.

(Organic Layer)

In the invention, the organic layer is a polymer layer formed by curing a radical-polymerizable monomer. Concretely, it is a layer of a thermoplastic resin such as polyester, acrylic resin, methacrylic resin (in this description, acrylic resin and methacrylic resin may be referred to as acrylate polymer), methacrylic acid/maleic acid copolymer, polystyrene, transparent fluororesin, polyimide, fluoropolyimide, polyamide, polyamidimide, polyetherimide, cellulose acylate, polyurethane, polyether ether ketone, polycarbonate, alicyclic polyolefin, polyarylate, polyether sulfone, polysulfone, fluorene ring-modified polycarbonate, alicyclic-modified polycarbonate, fluorene ring-modified polyester, and acryloyl compound, or a layer of a polysiloxane or any other organic silicon compound. The organic layer may be formed of a single material or a mixture of plural materials. Two or more organic layers may be laminated. In this case, the constitutive layers may have the same composition or different compositions.

Preferably, the organic layer in the invention is formed by curing at least one radical-polymerizable monomer of the following formula (4) or (5):

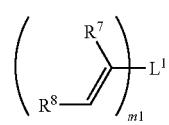

(4)

wherein $R^7$ represents a hydrogen atom or a methyl group; $R^8$ represents a hydrogen atom; $L^1$ represents a substituted or unsubstituted aliphatic hydrocarbon group having from 1 to 18 carbon atoms, a substituted or unsubstituted aromatic hydrocarbon group having from 6 to 18 carbon atoms, an ether group, an imino group, a carbonyl group, or a monovalent or polyvalent linking group comprising any of these groups bonding to each other in series; m1 indicates an integer of from 1 to 6; when m1 is 2 or more, $R^7$'s and $R^8$'s each may be the same or different.

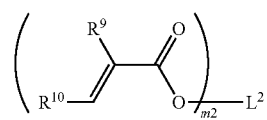

(5)

wherein $R^9$ represents a hydrogen atom or a methyl group; $R^{10}$ represents a hydrogen atom; $L^2$ represents a substituted or unsubstituted aliphatic hydrocarbon group having from 1 to 18 carbon atoms, a substituted or unsubstituted aromatic hydrocarbon group having from 6 to 18 carbon atoms, an ether group, an imino group, a carbonyl group, or a monovalent or polyvalent linking group comprising any of these groups bonding to each other in series; m2 indicates an integer of from 1 to 6; when m2 is 2 or more, $R^9$'s and $R^{10}$'s each may be the same or different.

Preferably, the organic layer in the invention comprises, as the main ingredient thereof, an acrylate polymer of a polymerizable monomer of the above formula (5). The main ingredient as referred to herein is meant to indicate the polymerizable monomer of which the content is the largest of the polymerizable monomers constituting the organic layer; and in general, its content is generally at least 80% by mass. The acrylate polymer is a polymer having a structural unit of the following formula (6):

In formula (6), Z represents any of the following (a) or (b); $R^{11}$ and $R^{12}$ in the structures each independently represent a hydrogen atom or a methyl group; * indicates the position at which the formula (6) bonds to the carbonyl group; L represents an n-valent linking group; n indicates an integer of from 1 to 6; and n Z's may be the same or different, but at least one Z is represented by the following (a):

Preferably, L has from 3 to 18 carbon atoms, more preferably from 4 to 17, even more preferably from 5 to 16, still more preferably from 6 to 15 carbon atoms.

When n is 2, L is a divalent linking group. Examples of the divalent linking group include an alkylene group (e.g., 1,3-propylene group, 2,2-dimethyl-1,3-propylene group, 2-butyl-2-ethyl-1,3-propylene group, 1,6-hexylene group, 1,9-nonylene group, 1,12-dodecylene group, 1,16-hexadecylene group), an ether group, an imino group, a carbonyl group, and a divalent residue comprising any of those divalent groups bonding to each other in series (e.g., polyethyleneoxy group, polypropyleneoxy group, propionyloxyethylene group, butyroyloxypropylene group, caproyloxyethylene group, caproyloxybutylene group).

Of those, an alkylene group is preferred.

L may have a substituent. Examples of the substituent with which L may be substituted include an alkyl group (e.g., methyl group, ethyl group, butyl group), an aryl group (e.g., phenyl group), an amino group (e.g., amino group, a methylamino group, a dimethylamino group, a diethylamino group), an alkoxy group (e.g., methoxy group, ethoxy group, butoxy group, 2-ethylhexyloxy group), an acyl group (e.g., acetyl group, a benzoyl group, formyl group, pivaloyl group), an alkoxycarbonyl group (e.g., methoxycarbonyl group, ethoxycarbonyl group), a hydroxy group, a halogen atom (e.g., fluorine atom, chlorine atom, bromine atom, iodine atom), a cyano group. Preferably, the substituent does not have an oxygen-containing functional group for the reasons mentioned below, and more preferred is an alkyl group.

Specifically, when n is 2, L is most preferably an alkylene group not having an oxygen-containing functional group. Employing the substituent makes it possible to lower the water vapor permeability of the film of the invention.

When n is 3, L is a trivalent linking group. Examples of the trivalent linking group include a trivalent residue to be derived from the above-mentioned divalent linking group by removing one hydrogen atom therefrom, or a trivalent residue to be derived from the above-mentioned divalent linking group by removing one hydrogen atom therefrom followed by substituting it with any of an alkylene group, an ether group, a carbonyl group and a divalent group comprising any of those divalent groups bonding to each other in series. Of those, preferred is a trivalent residue not having an oxygen-containing functional group, which is derived from an alkylene group by removing one hydrogen atom therefrom. Employing the residue makes it possible to lower the water vapor permeability of the film of the invention.

When n is 4 or more, L is a tetravalent or more polyvalent linking group. Examples of the tetravalent or more polyvalent linking group may be mentioned similarly to the above. Its preferred examples may also be mentioned similarly to the above. In particular, preferred is a tetravalent residue not having an oxygen-containing functional group, which is derived from an alkylene group by removing two hydrogen atoms therefrom. Employing the residue makes it possible to lower the water vapor permeability of the film of the invention.

The polymer may have any other structural unit than those of formula (6). For example, it may have a structural unit to be formed by copolymerization of an acrylate monomer or a methacrylate monomer with any others. In the polymer, the content of the structural unit not represented by the formula (6) is preferably at most 20% by mass, more preferably at most 15% by mass, even more preferably at most 10% by mass. The polymer not having the structural unit of formula (6) includes, for example, polyester, methacrylic acid/maleic acid copolymer, polystyrene, transparent fluororesin, polyimide, fluoropolyimide, polyamide, polyamidimide, polyether imide, cellulose acylate, polyurethane, polyether ketone, polycarbonate, alicyclic polyolefin, polyarylate, polyether sulfone, polysulfone, fluorene ring-modified polycarbonate, alicyclic-modified polycarbonate, and fluorene ring-modified polyester.

Specific examples of the polymerizable monomer of formula (5) are mentioned below, to which, however, the invention should not be limited.

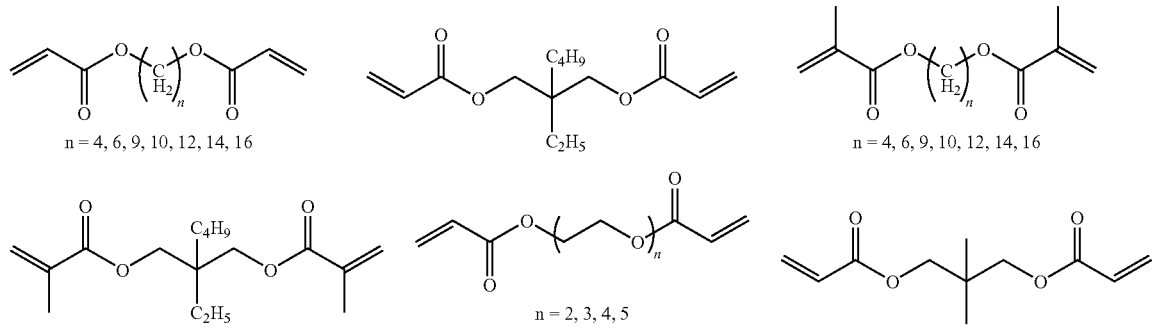

-continued
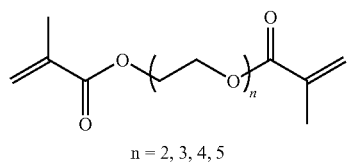
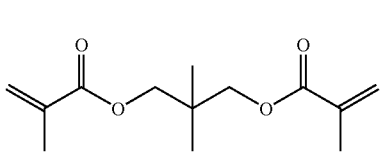
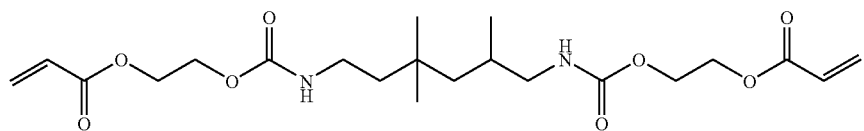
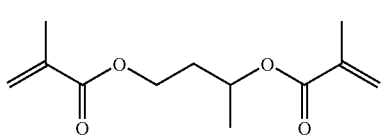
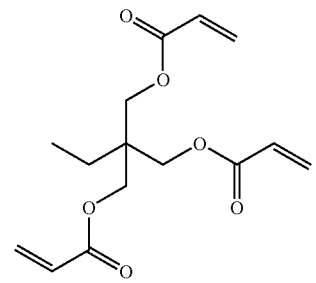
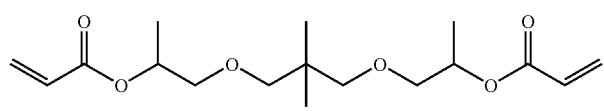
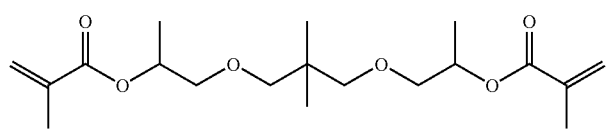
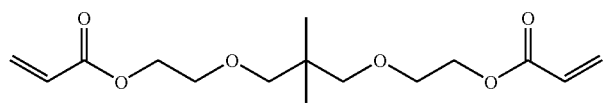
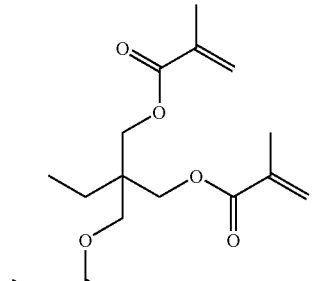
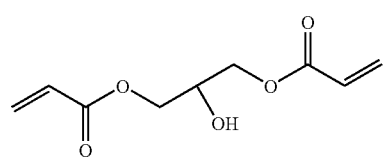
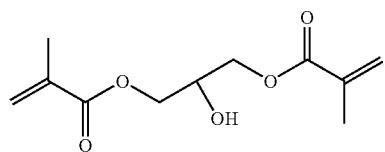
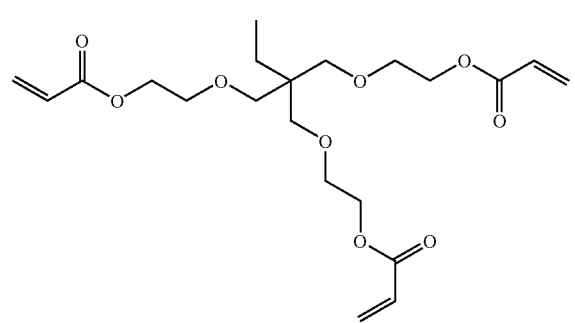

13
-continued
14
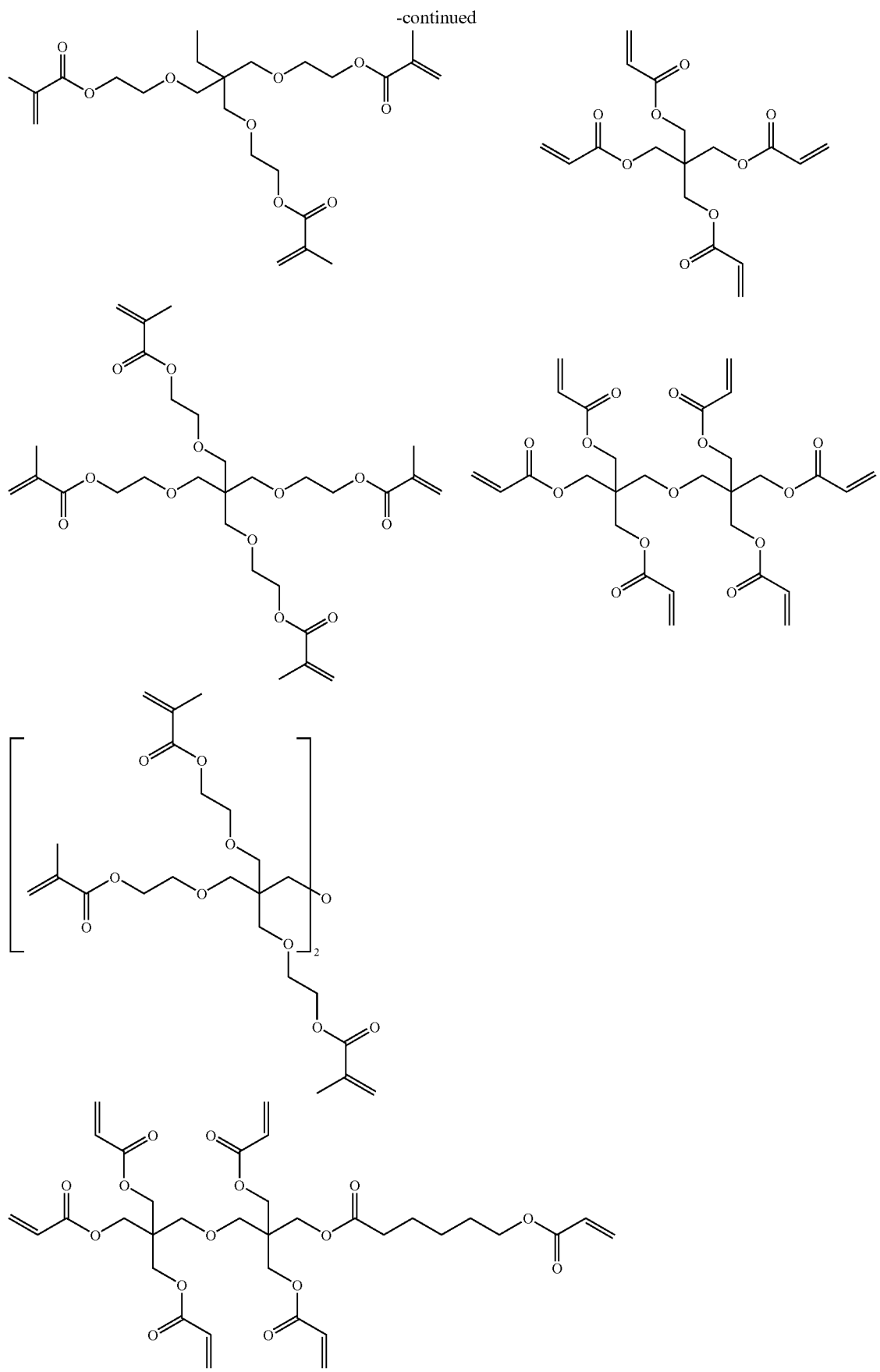

-continued
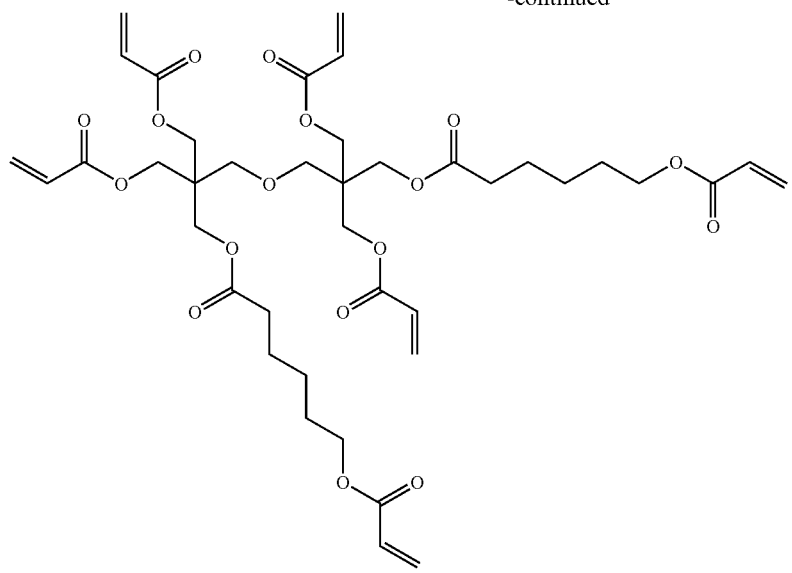
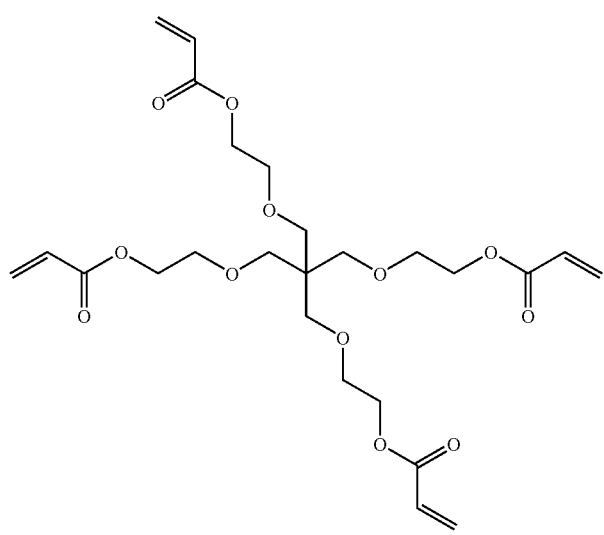
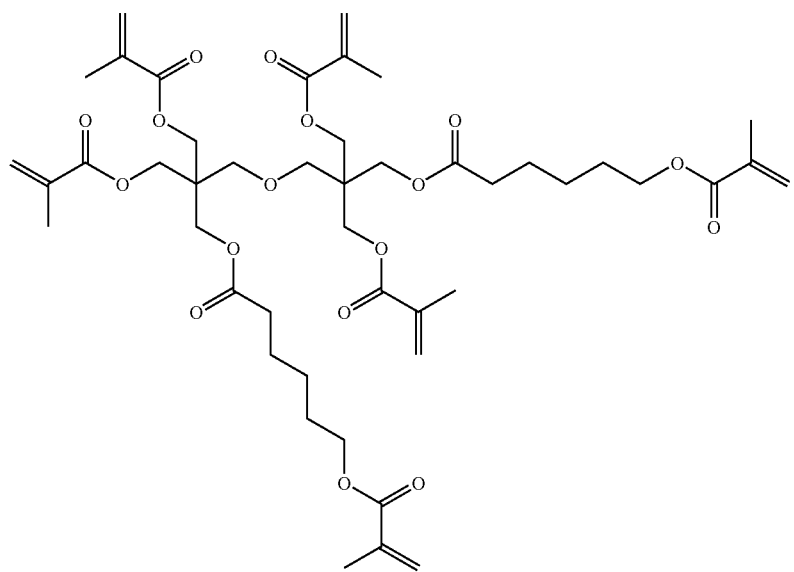

-continued
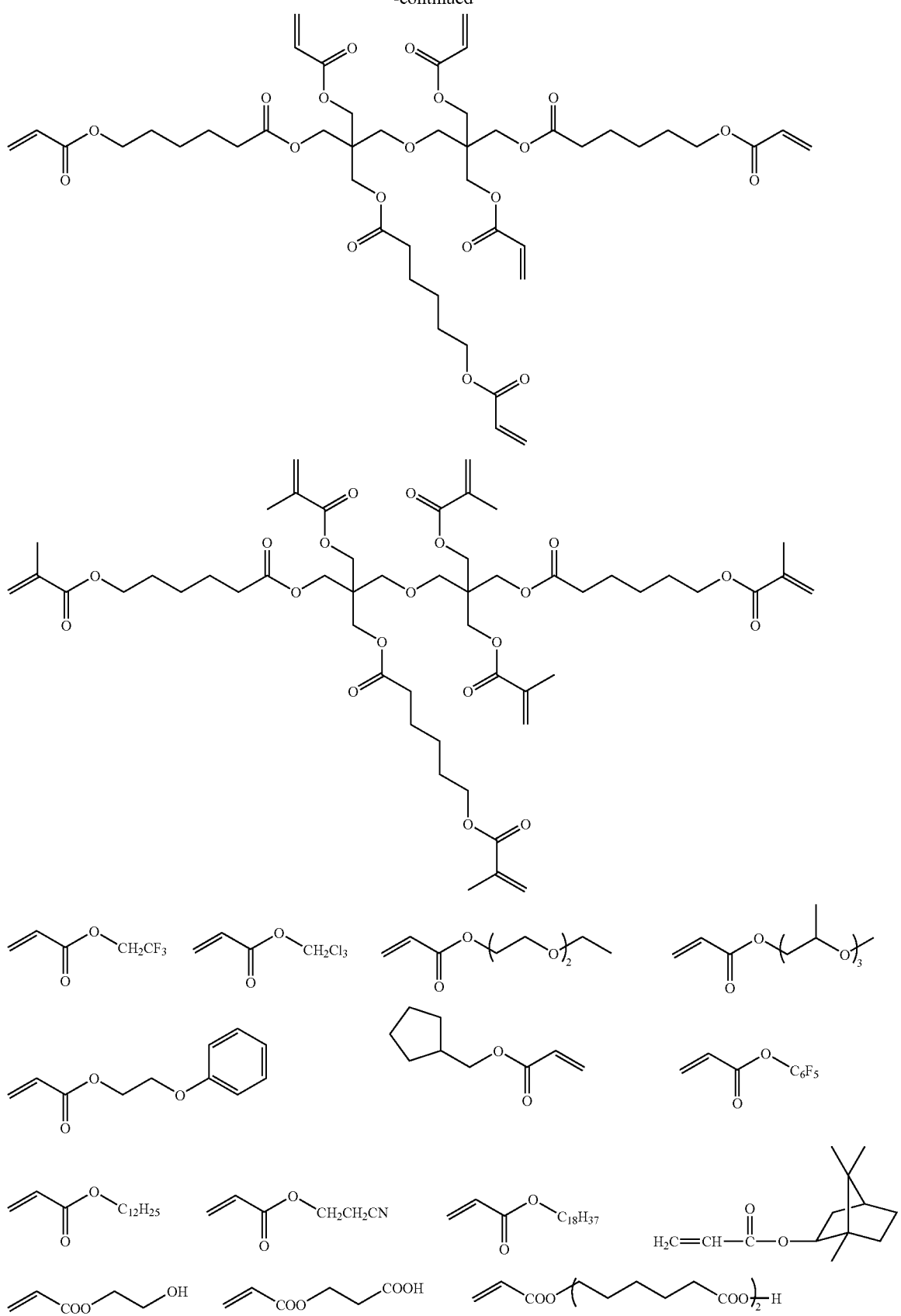

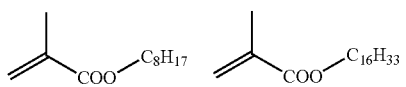 

The monomer mixture for use in the invention may contain a phosphoric acid-based (meth)acrylate monomer or a silane coupling group-containing (meth)acrylate monomer for enhancing the adhesiveness of the layer. The amount of the monomer of the type to be added may be so determined, depending on the number of the functional groups therein, that it may correspond to the above-mentioned amount of the monomer to be added.

Preferred examples of the phosphoric acid-based monomer or the silane coupling group-containing monomer are mentioned below, to which, however, the monomers usable in the invention should not be limited.

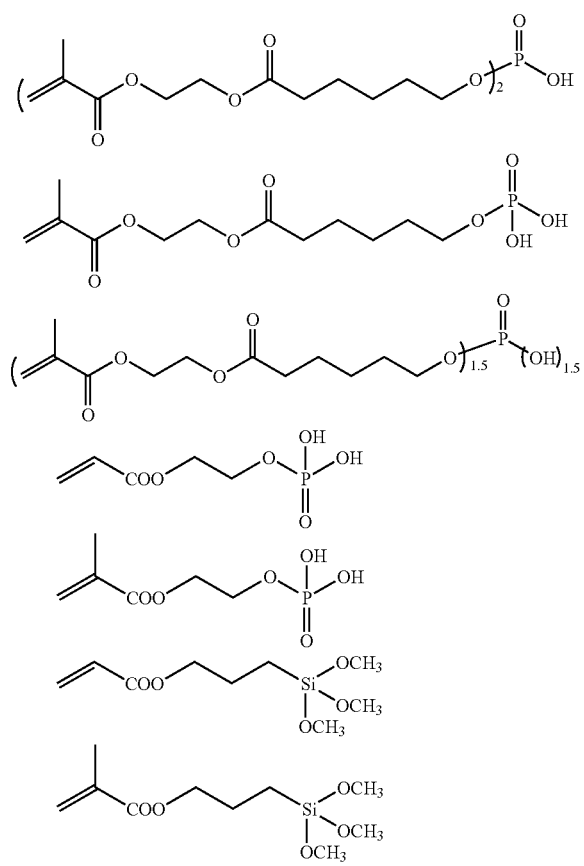

For forming the organic layer, a vacuum vapor deposition method is employed in the invention. The vacuum vapor deposition method is not specifically defined, for which, for example, preferred are a flash vapor deposition method and a plasma CVD method as in U.S. Pat. Nos. 4,842,893, 4,954, 371 and 5,032,461. Especially preferred is a flash vapor deposition method as having an effect of lowering the dissolved oxygen in monomer and capable of increasing the degree of monomer conversion.

The monomer polymerization method is not specifically defined, for which, for example, preferred is thermal polymerization, light (UV, visible light) polymerization, electron beam polymerization, plasma polymerization, or their combination. Of those, especially preferred is photopolymerization.

The light for irradiation is generally UV light from high-pressure mercy lamp or low-pressure mercy lamp. The irradiation energy is preferably at least 0.5 J/cm$^2$, more preferably at least 2 J/cm$^2$. Since acrylates and methacrylates receive polymerization inhibition by oxygen in air, it is desirable that the oxygen concentration or the oxygen partial pressure during the monomer polymerization is reduced. For this, employable is an inert gas purging method (e.g., nitrogen gas purging method, argon purging method), or a pressure reducing method. Of those, a reduced-pressure curing method is more favorable as having an effect of lowering the dissolved oxygen concentration in monomer.

In case where the oxygen concentration in polymerization is reduced according to a nitrogen purging method, the oxygen concentration is preferably at most 2%, more preferably at most 0.5%. In case where the oxygen partial pressure is reduced according to a pressure reducing method, the total pressure is preferably at most 1000 Pa, more preferably at most 100 Pa. Especially preferred is UV polymerization with energy irradiation of at least 2 J/cm$^2$ under a reduced pressure condition of at most 100 Pa. Most preferably, the monomer film formed according to a flash vapor deposition method is UV-polymerized by energy irradiation of at least 2 J/cm$^2$ under reduced pressure condition. Taking this method makes it possible to increase the monomer conversion to thereby form an organic layer having a high hardness. Preferably, the monomer polymerization is attained after the monomer mixture has been positioned in the intended site by vapor deposition.

Preferably, the degree of monomer conversion in polymerization is at lest 85%, more preferably at least 88%, even more preferably at least 90%, still more preferably at least 92%. The conversion in polymerization as referred to herein means the ratio of the reacted polymerizable group to all the polymerizable groups (acryloyl group and methacryloyl group) in the monomer mixture. The conversion in polymerization may be determined according to an IR absorptiometric method.

The thickness of the organic layer is not specifically defined. However, when too thin, the layer could not be uniform; but when too thick, the layer may be cracked and its barrier capability may lower. From these viewpoints, the thickness of the organic layer is preferably from 50 nm to 2000 nm, more preferably from 200 nm to 1500 nm.

Preferably, the organic layer is smooth. Preferably, the smoothness of the organic layer is on a level of at most 2 nm, more preferably at most 1 nm in terms of the mean roughness (Ra value) in 10 μm square. The organic layer is required to have neither impurities such as particles nor projections. Accordingly, it is desirable that the organic layer is formed in a clean room. Preferably, the degree of cleanness is at most class 10000, more preferably at most class 1000.

Two or more organic layers may be laminated. In this case, the layers may have the same composition or different compositions. In case where two or more layers are laminated, the individual organic layers are preferably so designed that they fall within the above-mentioned preferred ranges.

(Polymerization Initiator)

The gas-barrier film of the invention is characterized in that the organic layer therein is formed by vacuum vapor deposition of a composition containing a radical-polymerizable monomer and a polymerization initiator liquid followed by curing it.

The polymerization initiator for use in the invention is a polymerization initiator that has a melting point of not higher than 30° C., or a polymerization initiator that is liquid at 30° C. under one atmosphere. The melting point as referred to herein means a temperature at which a substance changes from a solid state to a liquid state. "Liquid" means that when a container with the polymerization initiator therein at 30° C. under one atmosphere is inclined, it shows flowability.

One or more different types of polymerization initiators may be used in the invention either singly or as combined. For example, two or more polymerization initiators that can be liquid when mixed are favorably used in the invention.

The polymerization initiator of the type can be actually liquid in forming the organic layer by vacuum vapor deposition, and therefore a small amount of the polymerization initiator can well cure the radical-polymerizable monomer. In addition, in the thus-stabilized organic layer, the remaining polymerizable monomer and polymerization initiator are hardly released into the adjacent inorganic layer and others, and therefore the inorganic layer can be protected from defoaming breakage.

In the invention, the amount of the remaining polymerizable monomer in the organic layer is preferably at most 5% by weight.

Preferably, the polymerization initiator for use in the invention has a molecular weight of at least 170, more preferably at least 190. Since the polymerization initiator having such a large molecular weight is used, it hardly evaporates away, and a stably cured organic layer is therefore easy to form. Not specifically defined, the uppermost limit of the molecular weight of the polymerization initiator may be generally at most 500.

Preferably, the proportion of the polymerization initiator in the composition to form the organic layer, comprising a radical-polymerizable monomer and the polymerization initiator, is at most 2% by weight, more preferably at most 1% by weight. In the invention, the organic layer is formed by vacuum vapor deposition, and therefore, even though the amount of the polymerization initiator to be added to the layer-forming composition is reduced as compared with that in a case of forming the organic layer by solution coating, the polymerizable monomer may be well reacted to form the layer, and accordingly, the amount of the polymerization initiator to be used in the invention can be reduced. Since the amount of the polymerization initiator to be added can be reduced, the amount of the remaining polymerization initiator can also be reduced therefore resulting in that the polymerization initiator-derived gas can be reduced and the damage to the adjacent inorganic layers and others can also be reduced.

The polymerization initiator for use in the invention comprises at least one of compounds of the following formula (1) or compounds of the following formula (2):

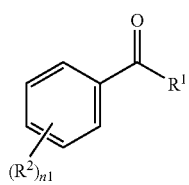
(1)

wherein $R^1$ represents a substituted or unsubstituted alkyl group having from 1 to 18 carbon atoms, a substituted or unsubstituted aryl group having from 6 to 18 carbon atoms, a carbonyl group, or a substituent comprising any two or more such groups bonding to each other; $R^2$ represents a substituted or unsubstituted alkyl group having from 1 to 18 carbon atoms, a substituted or unsubstituted aryl group having from 6 to 18 carbon atoms, an amino group, an alkoxy group, an acyl group, an alkoxycarbonyl group, an alkylthio group, an arylthio group, a hydroxy group, a halogen atom, or a cyano group; n1 indicates an integer of from 0 to 5; when n1 is 2 or more, $R^2$'s may be the same or different.

$R^1$ is preferably a substituted or unsubstituted alkyl group having from 1 to 18 carbon atoms, or a substituted or unsubstituted aryl group having from 6 to 18 carbon atoms; $R^2$ is preferably a substituted or unsubstituted alkyl group having from 1 to 18 carbon atoms. In case where $R^1$ is a substituted alkyl group having from 1 to 18 carbon atoms, preferably, the carbon atom thereof bonding to the carbonyl group is substituted with an alkoxy group, a hydroxyl group or an amino group. n1 is preferably from 0 to 3.

As these compounds, for example, usable are commercial products such as Darocur 1173 (by Ciba Speciality Chemicals)

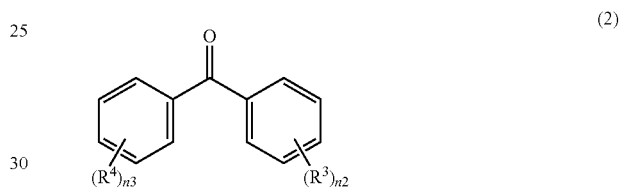
(2)

wherein $R^3$ represents a substituted or unsubstituted alkyl group having from 1 to 18 carbon atoms, a substituted or unsubstituted aryl group having from 6 to 18 carbon atoms, an amino group, an alkoxy group, an acyl group, an alkoxycarbonyl group, an alkylthio group, an arylthio group, a hydroxy group, a halogen atom, or a cyano group; $R^4$ represents a substituted or unsubstituted alkyl group having from 1 to 18 carbon atoms, a substituted or unsubstituted aryl group having from 6 to 18 carbon atoms, an amino group, an alkoxy group, an acyl group, an alkoxycarbonyl group, an alkylthio group, an arylthio group, a hydroxy group, a halogen atom, or a cyano group; n2 and n3 each indicate an integer of from 0 to 5, but both n2 and n3 are not 0 at the same time; when n2 is 2 or more, $R^3$'s may be the same or different; and when n3 is 2 or more, $R^4$'s may be the same or different.

$R^3$ is preferably a substituted or unsubstituted alkyl group having from 1 to 18 carbon atoms; and $R^4$ is preferably a substituted or unsubstituted alkyl group having from 1 to 18 carbon atoms. n2 is preferably from 0 to 3; and n3 is preferably from 0 to 3.

The compounds include 2-methylbenzophenone and others; and for example, commercial products such as Esacure TZT (by Lamberti) can be used.

(Inorganic Layer)

In general, the inorganic layer is a thin film layer of a metal compound. For forming the inorganic layer, usable is any method capable of forming the intended thin film. For example, usable are physical vapor deposition methods (PVD) such as evaporation method, sputtering method and ion-plating method; various chemical vapor deposition methods (CVD); and liquid-phase growth methods such as plating method and sol-gel method. Of those, preferred are physical vapor deposition methods (PVD) and chemical vapor deposition methods (CVD), in which thermal influence on the substrate film in inorganic layer formation may be evaded, the production speed is high, and a uniform thin film layer is easy to form. Not specifically defined, the ingredients constituting the inorganic layer may be any ones satisfying the above-mentioned requirements, for which, for example, usable are oxides, nitrides or oxinitrides of at least one metal selected from Si, Al, In, Sn, Zn, Ti, Cu, Ce, Ta and the like. Of those, preferred are oxides, nitrides or oxinitrides of a metal selected from Si, Al, In, Sn, Zn and Ti; more preferred are metal oxides, nitrides or oxinitrides with Si or Al. These may contain any other subsidiary element.

In the invention, the inorganic layer is formed on the above-mentioned, smooth and hard organic layer, and therefore, the inorganic layer thus formed thereon may have a smooth surface. Accordingly, even though the thickness of the inorganic layer is thin, the film may secure good barrier capability. The effect results from the organic layer satisfying the two requirements of smoothness and hardness. For example, when a sputtering method is employed for inorganic layer formation, the inorganic substance to be deposited on the organic layer has kinetic energy. Accordingly, in case where the inorganic layer is to be formed on a smooth but soft organic layer, the surface of the organic layer may be roughened by the shock of the inorganic substance being deposited thereon, and therefore the surface smoothness of the inorganic layer formed may be worsened. In the invention, since the organic layer is smooth and hard, it can bear the shock, and therefore realizing the formation of the inorganic layer that is smooth and thin and has good barrier capability.

Preferably, the surface smoothness of the inorganic layer formed in the invention is less than 2 nm in terms of the mean roughness (Ra value) in 10 μm square, more preferably at most 1 nm. Accordingly, it is desirable that the inorganic layer is formed in a clean room. Preferably, the degree of cleanness is at most class 10000, more preferably at most class 1000.

Not specifically defined, the thickness of the inorganic layer is generally within a range of from 5 nm to 500 nm/layer. The gas-barrier film of the invention shows good barrier capability even though the inorganic layer constituting it is thin, and therefore, the inorganic layer is preferably as thin as possible for increasing the producibility and reducing the production cost. The thickness of the inorganic layer is preferably from 20 to 200 nm.

Two or more inorganic layers may be laminated. In this case, the layers may have the same composition or different compositions. In case where two or more layers are laminated, the individual inorganic layers are preferably so designed that they fall within the above-mentioned preferred ranges.

(Lamination of Organic Layer and Inorganic Layer)

The organic layer and the inorganic layer may be laminated by repeated film formation to form the organic layer and the inorganic layer in a desired layer constitution. In case where the inorganic layer is formed according to a vacuum film formation method such as sputtering method, vacuum vapor deposition method, ion plating method or plasma CVD method, then it is desirable that the organic layer is also formed according to a vacuum film formation method such as the above-mentioned flash vapor deposition method. While the barrier layer is formed, it is especially desirable that the organic layer and the inorganic layer are laminated all the time in a vacuum of at most 1000 Pa, not restoring the pressure to an atmospheric pressure during the film formation. More preferably, the pressure is at most 100 Pa, even more preferably at most 50 Pa, still more preferably at most 20 Pa.

<Device>

The gas-barrier film of the invention is favorably used for devices that are deteriorated by the chemical components in air (e.g., oxygen, water, nitrogen oxide, sulfur oxide, ozone). Examples of the devices are, for example, organic EL devices, liquid-crystal display devices, thin-film transistors, touch panels, electronic papers, solar cells, and other electronic devices. More preferred are organic EL devices.

The gas-barrier film of the invention may be used as a substrate of a device or as a film for sealing up according to a solid sealing method. The solid sealing method comprises forming a protective layer on a device, then forming an adhesive layer and a gas-barrier film as laminated thereon, and curing it. Not specifically defined, the adhesive may be a thermosetting epoxy resin, a photocurable acrylate resin, etc.

(Organic EL Device)

Examples of an organic EL device with a gas-barrier film are described in detail in JP-A 2007-30387.

(Liquid-Crystal Display Device)

A reflection-type liquid-crystal display device has a constitution of a lower substrate, a reflection electrode, a lower alignment film, a liquid-crystal layer, an upper alignment film, a transparent electrode, an upper substrate, a λ/4 plate and a polarizing film, formed in that order from the bottom. In this, the gas-barrier film of the invention may be used as the transparent electrode substrate and the upper substrate. In color displays, it is desirable that a color filter layer is additionally provided between the reflection electrode and the lower alignment film, or between the upper alignment film and the transparent electrode. A transmission-type liquid-crystal display device has a constitution of a backlight, a polarizer, a λ/4 plate, a lower transparent electrode, a lower alignment film, a liquid-crystal layer, an upper alignment film, an upper transparent electrode, an upper substrate, a λ/4 plate and a polarizing film, formed in that order from the bottom. In this, the gas-barrier film of the invention may be used as the upper transparent electrode and the upper substrate. In color displays, it is desirable that a color filter layer is additionally provided between the lower transparent electrode and the lower alignment film, or between the upper alignment film and the transparent electrode. Not specifically defined, the type of the liquid-crystal cell is preferably a TN (twisted nematic) type, an STN (super-twisted nematic) type, a HAN (hybrid aligned nematic) type, a VA (vertically alignment) type, an ECB (electrically controlled birefringence) type, an OCB (optically compensated bend) type, a CPA (continuous pinwheel alignment) type, or an IPS (in-plane switching) type.

(Others)

Other applications of the invention are thin-film transistors as in JP-T 10-512104, touch panels as in JP-A 5-127822, 2002-48913, electronic papers as in JP-A 2000-98326, and solar cells as in Japanese Patent Application No. 7-160334.

<Optical Component>

An example of the optical component that comprises the gas-barrier film of the invention is a circular polarizer.

(Circular Polarizer)

Laminating a gas-barrier film of the invention with a λ/4 plate and a polarizer gives a circular polarizer. In this case, the components are so laminated that the slow axis of the λ/4 plate could cross the absorption axis of the polarizer at an angle of 45°. The polarizer is preferably stretched in the direction of 45° from the machine direction (MD) thereof; and for example, those described in JP-A 2002-86554 are favorably used.

EXAMPLES

The characteristics of the invention are described more concretely with reference to the following Examples. In the following Examples, the material used, its amount and the ratio, the details of the treatment and the treatment process may be suitably modified or changed not overstepping the sprit and the scope of the invention. Accordingly, the invention should not be limitatively interpreted by the Examples mentioned below. Unless otherwise specifically indicated, the organic layer and the inorganic layer were all formed in a clean room of class 1000.

1. Formation of Gas-Barrier Film:

Gas-barrier film samples 101 to 110 shown in Table 1 were produced according to the process mentioned below.

(1-1) Formation of First Layer (Organic Layer):

A polyethylene naphthalate film (PEN film, Teijin DuPont's trade name, Teonex Q65FA) was cut into 20 cm square pieces. Using an organic/inorganic laminate film formation device (Vitex Systems' Guardian 200), an organic layer was formed on the side of the smooth surface of film for samples 101 to 108. In this device, an organic layer and an inorganic layer are formed continuously all in vacuum, and therefore, the barrier laminate to be produced therein is not exposed to open air until the completion of its production. The organic layer formation method using this device is flash vapor deposition under an inner pressure of 3 Pa, and the UV irradiation energy for polymerization is 2 J/cm². As the starting material for the organic layer, used was a mixed solution of BEPGA (60 g), TMPTA (40 g), and a UV polymerization initiator (1.5 g). The polymerization initiator used is shown in Table 1.

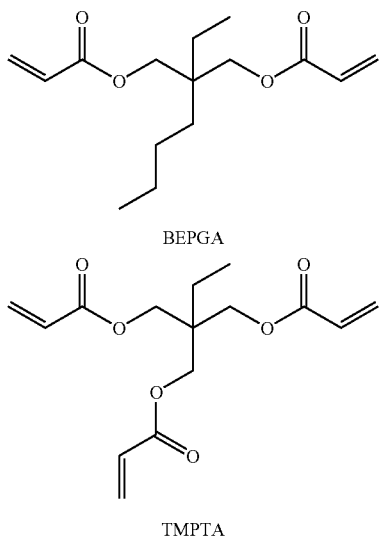

BEPGA

TMPTA

The following are for demonstrating the influence of the varying amount of the polymerization initiator used on the film formation. An organic layer of Sample 109 was formed in the same manner as in sample 101 in the above (1-1), for which, however, the amount of the polymerization initiator was changed to 0.6 g. An organic layer of sample 110 was formed in the same manner as in sample 101 in the above (1-1), for which, however, the amount of the polymerization initiator was changed to 2.3 g.

(1-2) Formation of Second Layer (Inorganic Layer):

Subsequently using Guardian 200 used in (1-1), gas-barrier films of samples 101 to 110 were produced. Not released from the vacuum condition, the organic layer and the inorganic layer of samples 101 to 110 were continuously formed all in the vacuum device. The inorganic layer was formed in a mode of aluminum film formation according to a reactive sputtering method under direct current pulse application, in which the target is aluminum and the reactive gas is oxygen. The formed inorganic layer (aluminum oxide) had a thickness of 60 nm. The characteristic data (water vapor permeability) of the thus-obtained gas-barrier films are shown in Table 1.

(1-3) Determination of Water Vapor Permeability by Ca Method:

According to the method described in the reference mentioned below, the water vapor permeability of each sample at 40° C. and a relative humidity of 90% were measured.

<Reference>

G. NISATO, P. C. P. BOUTEN, P. J. SLIKKERVEER, et al.; SID Conference Record of the International Display Research Conference, pp. 1435-1438

2. Evaluation of Polymerization Initiator:

(Determination of Morphology at Room Temperature)

Under the condition of one atmosphere at 30° C., a container with the polymerization initiator to be tested therein was gently inclined by about 15 degrees, and left as such for about 10 minutes, whereupon the sample showing flowability and running in the container was judged liquid.

(Method of Determination of Molecular Weight)

A mixed polymerization initiator of two or more compounds was determined as follows: The molecular weight of each compound was multiplied by the content thereof, and the data were summed up to give the mean molecular weight of the mixture. In case where the content is unknown, the molecular weight of the mixture was defined within the range of the molecular weight of the initiator compounds constituting the mixture.

As is obvious from the results in Table 1, it is known that the samples produced by the use of the liquid polymerization initiator had a lower water vapor permeability and therefore had more excellent barrier capability than those produced by the use of the powdery polymerization initiator. In addition, it is also known that, when the liquid polymerization initiator having a larger molecular weight was used, the samples produced had a lower water vapor permeability and therefore had more excellent barrier capability.

TABLE 1

| Sample No. | Polymerization Initiator | | Melting Point (° C.) | Morphology at room temperature | Molecular Weight | Water Vapor Permeability (g/m² · day) |
| | substance name/ trade name | manufacturer | | | | |
|---|---|---|---|---|---|---|
| 101 (the invention) | Esacure TZT | Lamberti | unknown | liquid | 196.24–224.30 | 0.0020 |
| 102 (the invention) | Darocur 1173 | Ciba Speciality Chemicals | 4 | liquid | 164.20 | 0.0039 |
| 103 (the invention) | Irgacure 1000 | Ciba Speciality Chemicals | <4 | liquid | 172.21 | 0.0031 |

TABLE 1-continued

| Sample No. | Polymerization Initiator substance name/ trade name | manufacturer | Melting Point (° C.) | Morphology at room temperature | Molecular Weight | Water Vapor Permeability (g/m² · day) |
|---|---|---|---|---|---|---|
| 104 (the invention) | Irgacure 500 | Ciba Speciality Chemicals | about 18 | liquid | 193.24 | 0.0025 |
| 105 (the invention) | 2-methylbenzophenone | Aldrich | unknown | liquid | 196.24 | 0.0022 |
| 106 (comparative sample) | benzophenone | Aldrich | 45-49 | powdery | 182.22 | 0.0070 |
| 107 (comparative sample) | Irgacure 651 | Ciba Speciality Chemicals | 64-67 | powdery | 256.30 | 0.0055 |
| 108 (comparative sample) | Irgacure 184 | Ciba Speciality Chemicals | 45-49 | powdery | 204.26 | 0.0067 |
| 109 (the invention) | Esacure TZT | Lamberti | unknown | liquid | 196.24-224.30 | 0.0011 |
| 110 (the invention) | Esacure TZT | Lamberti | unknown | liquid | 196.24-224.30 | 0.0029 |

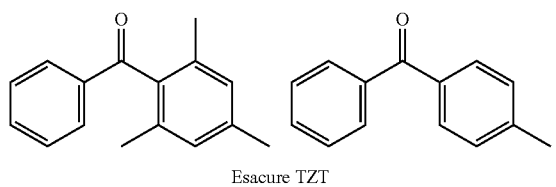

Esacure TZT

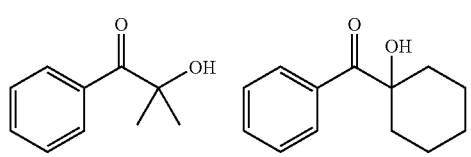

Irgacure 1000

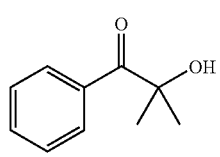

Darocur 1173

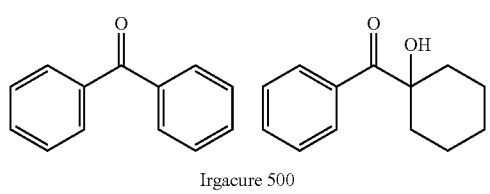

Irgacure 500

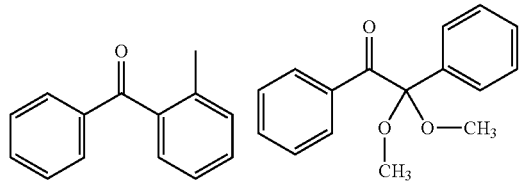

2-Methylbenzophenone     Irgacure 651

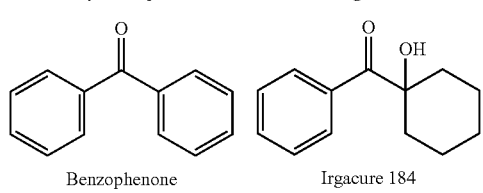

Benzophenone     Irgacure 184

3. Formation of Multilayer Laminate Gas-Barrier Film:

Gas-barrier film samples 201 to 207 having the layer constitution (Y is organic layer, X is inorganic layer) shown in Table 2 were produced according to the same method as that of the gas-barrier film formation in the above 1, for which, however, the constitutive layers were suitably laminated.

4. Formation and Evaluation of Organic EL Device:

(4-1) Formation of Organic EL Device:

An ITO film-having conductive glass substrate (surface resistivity, 10 Ω/square) was washed with 2-propanol, and then processed for UV-ozone treatment for 10 minutes. The following organic compound layers were formed in order on the substrate (anode) according to a vacuum vapor deposition method.

| (First Hole Transportation Layer) | |
|---|---|
| Copper Phthalocyanine | thickness 10 nm |
| (Second Hole Transportation Layer) | |
| N,N'-diphenyl-N,N'-dinaphthylbenzidine | thickness 40 nm |
| (Light Emission Layer serving also as electron transportation layer) | |
| Tris(8-hydroxyquinolinato)aluminum | thickness 60 nm |

Finally, lithium fluoride was vapor-deposited in a thickness of 1 nm and metal aluminum was in a thickness of 100 nm in that order, serving as a cathode. On this, a silicon nitride film having a thickness of 5 μm was formed according to a parallel plate CVD method, thereby constructing an organic EL device.

(4-2) Installation of Gas-Barrier Film on Organic EL Device:

Using a thermosetting adhesive (Daizo-Nichimori's Epotec 310), the gas barrier film of samples 201 to 207 was stuck to the device, and heated at 65° C. for 3 hours to cure the adhesive. Thus sealed, 20 samples of every organic EL device were produced.

(4-3) Evaluation of Light-Emitting Surface of Organic EL Device:

Immediately after their production, the organic EL devices were driven for light emission at a voltage of 7V applied thereto, using a source measure unit, Keithley's SMU2400 Model. Using a microscope, the surface of each sample was checked for its condition with light emission, and it was confirmed that all the devices gave uniform light emission with no dark spot.

Next, the devices were kept in a dark room at 60° C. and a relative humidity of 90% for 500 hours, and checked for the surface condition with light emission. The driven samples were visually checked for the presence or absence of dark spots. The proportion of the samples having dark spots larger than 300 μm in diameter was defined as a failure rate. Table 2 shows the failure rate of each tested device.

TABLE 2

| Sample No. | Polymerization Initiator substance name/trade name | amount added | Layer Constitution | Failure Rate |
|---|---|---|---|---|
| 201 (the invention) | Esacure TZT | 1.5 g | PEN/Y/X/Y/X/Y/X/Y/X | 5% |
| 202 (the invention) | Darocur 1173 | 1.5 g | PEN/Y/X/Y/X/Y/X/Y/X | 20% |
| 203 (the invention) | Irgacure 500 | 1.5 g | PEN/Y/X/Y/X/Y/X/Y/X | 10% |
| 204 (comparative sample) | benzophenone | 1.5 g | PEN/Y/X/Y/X/Y/X/Y/X | 90% |
| 205 (the invention) | Esacure TZT | 0.6 g | PEN/Y/X/Y/X/Y/X/Y/X | 0% |
| 206 (the invention) | Esacure TZT | 0.6 g | PEN/Y/X/Y/X/Y/X/Y/X/Y | 0% |
| 207 (the invention) | Esacure TZT | 0.6 g | PEN/X/Y/X/Y/X/Y/X/Y | 0% |

As is obvious from the results in Table 2, it is known that the organic EL device sealed up with any of the gas barrier film samples 201 to 203 and 205 to 207 of the invention is excellent in wet heat durability. In addition, it is known that the gas-barrier film of the invention for which the amount of the polymerization initiator material used is small brings about a low failure rate when applied to an organic EL device, and is especially favorable.

In the above, an organic EL device was formed in which the gas barrier film of samples 201 to 207 was used as the substrate in place of the glass substrate, and was continuously driven at 500 cd/m$^2$ necessary for TV and others, and its brightness was measured. The samples where the gas-barrier film of the invention was used as the substrate had a low failure rate; but the samples where the comparative gas-barrier film was used were deteriorated sooner.

5. Formation of Gas-Barrier Film with Low-Retardation Substrate Film:

Gas-barrier film samples 301 to 304 were produced in the same manner as that for the production of the sample 207 given in Table 2, for which, however, the substrate film, polyethylene naphthalate film (PEN film, Teijin-DuPont's trade name, Teonex Q65FA) was changed to any of other four types, cycloolefin polymer film (COP film, Nippon Zeon's trade name, Zeonoa ZF-16), transparent polyimide film (PI film, Mitsubishi Gas Chemical's trade name, Neoprim), polycarbonate film (Teijin Chemical's trade name, Pureace T-138 (¼ wavelength plate), Panlite D-92) According to the process of the above (4-2), organic EL devices sealed up with any of the gas-barrier film samples 301 to 304 were produced, and evaluated according to the process of (4-3). The failure rate of these devices was all 0%.

INDUSTRIAL APPLICABILITY

The gas-barrier film produced according to the production method of the invention has a low water vapor permeability. The gas-barrier film of the invention can be produced with ease. Further, the organic EL device of the invention has high-level industrial applicability and is useful, since its water vapor permeability is low and its failure rate is low.

While the present invention has been described in detail and with reference to specific embodiments thereof, it will be apparent to one skilled in the art that various changes and modifications can be made therein without departing from the spirit and scope thereof.

The present disclosure relates to the subject matter contained in Japanese Patent Application No. 337413/2007 filed on Dec. 27, 2007 and No. 49576/2008 filed on Feb. 29, 2008, which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A gas-barrier film comprising at least one organic layer and at least one inorganic layer on a substrate film, wherein the organic layer is formed by vacuum vapor deposition of a composition containing a radical-polymerizable monomer and a polymerization initiator, followed by curing the composition, the polymerization initiator being liquid at 30° C. under one atmosphere and/or having a melting point of not higher than 30° C.;
   wherein the composition contains the polymerization initiator in a ratio of at most 2% by weight; and
   wherein the composition contains 0.6 to 2.3 g of the polymerization initiator per 100 g of the radical-polymerizable monomer.

2. The gas-barrier film according to claim 1, wherein the polymerization initiator is liquid at 30° C. under one atmosphere.

3. The gas-barrier film according to claim 1, wherein the polymerization initiator has a melting point of not higher than 30° C.

4. The gas-barrier film according to claim 1, wherein the molecular weight of the polymerization initiator is at least 170.

5. The gas-barrier film according to claim 1, wherein the polymerization initiator is at least one compound of the following general formula (1):

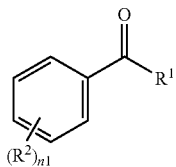

(1)

wherein $R^1$ represents a substituted or unsubstituted alkyl group having from 1 to 18 carbon atoms, a substituted or unsubstituted aryl group having from 6 to 18 carbon atoms, a carbonyl group, or a substituent comprising any two or more such groups bonding to each other; $R^2$ represents a substituted or unsubstituted alkyl group having from 1 to 18 carbon atoms, a substituted or unsubstituted aryl group having from 6 to 18 carbon atoms, an amino group, an alkoxy group, an acyl group, an alkoxycarbonyl group, an alkylthio group, an arylthio group, a hydroxy group, a halogen atom, or a cyano group; n1 indicates an integer of from 0 to 5; when n1 is 2 or more, $R^2$'s may be the same or different.

6. The gas-barrier film according to claim 1, wherein the polymerization initiator contains at least one compound of the following general formula (2):

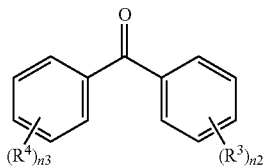

(2)

wherein $R^3$ represents a substituted or unsubstituted alkyl group having from 1 to 18 carbon atoms, a substituted or unsubstituted aryl group having from 6 to 18 carbon atoms, an amino group, an alkoxy group, an acyl group, an alkoxycarbonyl group, an alkylthio group, an arylthio group, a hydroxy group, a halogen atom, or a cyano group; $R^4$ represents a substituted or unsubstituted alkyl group having from 1 to 18 carbon atoms, a substituted or unsubstituted aryl group having from 6 to 18 carbon atoms, an amino group, an alkoxy group, an acyl group, an alkoxycarbonyl group, an alkylthio group, an arylthio group, a hydroxy group, a halogen atom, or a cyano group; n2 and n3 each indicate an integer of from 0 to 5, but both n2 and n3 are not 0 at the same time; when n2 is 2 or more, $R^3$'s may be the same or different; and when n3 is 2 or more, $R^4$'s may be the same or different.

7. The gas-barrier film according to claim 1, wherein the organic layer is formed by flash vapor deposition.

8. The gas-barrier film according to claim 1, wherein the radical-polymerizable monomer constituting the organic layer is at least one selected from compounds of the following formula (4):

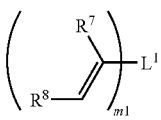

(4)

wherein $R^7$ represents a hydrogen atom or a methyl group; $R^8$ represents a hydrogen atom; $L^1$ represents a substituted or unsubstituted aliphatic hydrocarbon group having from 1 to 18 carbon atoms, a substituted or unsubstituted aromatic hydrocarbon group having from 6 to 18 carbon atoms, an ether group, an imino group, a carbonyl group, or a monovalent or polyvalent linking group comprising any of these groups bonding to each other in series; m1 indicates an integer of from 1 to 6; when m1 is 2 or more, $R^7$'s and $R^8$'s each may be the same or different.

9. The gas-barrier film according to claim 1, wherein the radical-polymerizable monomer constituting the organic layer is at least one selected from compounds of the following formula (5):

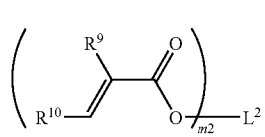

(5)

wherein $R^9$ represents a hydrogen atom or a methyl group; $R^{10}$ represents a hydrogen atom; $L^2$ represents a substituted or unsubstituted aliphatic hydrocarbon group having from 1 to 18 carbon atoms, a substituted or unsubstituted aromatic hydrocarbon group having from 6 to 18 carbon atoms, an ether group, an imino group, a carbonyl group, or a monovalent or polyvalent linking group comprising any of these groups bonding to each other in series; m2 indicates an integer of from 1 to 6; when m2 is 2 or more, $R^9$'s and $R^{10}$'s each may be the same or different.

10. An optical component comprising a gas-barrier film of claim 1 as the substrate thereof.

11. A device comprising the gas-barrier film of claim 1.

12. The device according to claim 11 wherein the gas-barrier film is used as a sealant film.

13. The device according to claim 11 wherein the gas-barrier film is used as a substrate.

14. The device according to claim 11, which is an electronic device.

15. The device according to claim 11, which is an organic EL device.

16. A method for producing a gas-barrier film comprising at least one organic layer and at least one inorganic layer on a substrate film, wherein the method comprises conducting vacuum vapor deposition of a composition containing a radical-polymerizable monomer and a polymerization initiator and then curing the composition to form an organic layer, the polymerization initiator being liquid at 30° C. under one atmosphere and/or having a melting point of not higher than 30° C.;

wherein the composition contains the polymerization initiator in a ratio of at most 2% by weight; and wherein the composition contains 0.6 to 2.3 g of the polymerization initiator per 100 g of the radical-polymerizable monomer.

17. The method for producing a gas-barrier film according to claim 16, wherein the polymerization initiator is liquid at 30° C. under one atmosphere.

18. The method for producing a gas-barrier film according to claim 16, wherein the polymerization initiator has a melting point of not higher than 30° C.

19. The method for producing a gas-barrier film according to claim 16, wherein a polymerization initiator having a molecular weight of at least 170 is used.

20. The method for producing a gas-barrier film according to claim 16, wherein a polymerization initiator containing at least one compound of the following formula (1) is used:

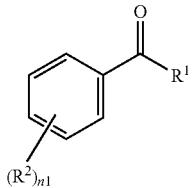

(1)

wherein $R^1$ represents a substituted or unsubstituted alkyl group having from 1 to 18 carbon atoms, a substituted or unsubstituted aryl group having from 6 to 18 carbon atoms, a carbonyl group, or a substituent comprising any two or more such groups bonding to each other; $R^2$ represents a substituted or unsubstituted alkyl group having from 1 to 18 carbon atoms, a substituted or unsubstituted aryl group having from 6 to 18 carbon atoms, an amino group, an alkoxy group, an acyl group, an alkoxycarbonyl group, an alkylthio group, an arylthio group, a hydroxy group, a halogen atom, or a cyano group; n1 indicates an integer of from 0 to 5; when n1 is 2 or more, $R^2$'s may be the same or different.

21. The method for producing a gas-barrier film according to claim 16, wherein a polymerization initiator containing at least one compound of the following formula (2) is used:

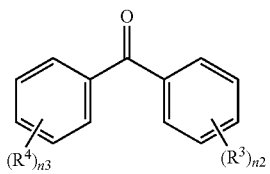

(2)

wherein $R^3$ represents a substituted or unsubstituted alkyl group having from 1 to 18 carbon atoms, a substituted or unsubstituted aryl group having from 6 to 18 carbon atoms, an amino group, an alkoxy group, an acyl group, an alkoxycarbonyl group, an alkylthio group, an arylthio group, a hydroxy group, a halogen atom, or a cyano group; $R^4$ represents a substituted or unsubstituted alkyl group having from 1 to 18 carbon atoms, a substituted or unsubstituted aryl group having from 6 to 18 carbon atoms, an amino group, an alkoxy group, an acyl group, an alkoxycarbonyl group, an alkylthio group, an arylthio group, a hydroxy group, a halogen atom, or a cyano group; n2 and n3 each indicate an integer of from 0 to 5, but both n2 and n3 are not 0 at the same time; when n2 is 2 or more, $R^3$'s may be the same or different; and when n3 is 2 or more, $R^4$'s may be the same or different.

22. The method for producing a gas-barrier film according to claim 16, wherein the organic layer is formed by flash vapor deposition.

23. The method for producing a gas-barrier film according to claim 16, wherein the radical-polymerizable monomer constituting the organic layer is at least one selected from compounds of the following formula (4):

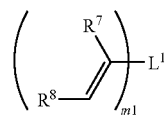

(4)

wherein $R^7$ represents a hydrogen atom or a methyl group; $R^8$ represents a hydrogen atom; $L^1$ represents a substituted or unsubstituted aliphatic hydrocarbon group having from 1 to 18 carbon atoms, a substituted or unsubstituted aromatic hydrocarbon group having from 6 to 18 carbon atoms, an ether group, an imino group, a carbonyl group, or a monovalent or polyvalent linking group comprising any of these groups bonding to each other in series; m1 indicates an integer of from 1 to 6; when m1 is 2 or more, $R^7$'s and $R^8$'s each may be the same or different.

24. The method for producing a gas-barrier film according to claim 16, wherein the radical-polymerizable monomer constituting the organic layer is at least one selected from compounds of the following formula (5):

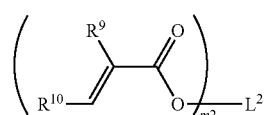

(5)

wherein $R^9$ represents a hydrogen atom or a methyl group; $R^{10}$ represents a hydrogen atom; $L^2$ represents a substituted or unsubstituted aliphatic hydrocarbon group having from 1 to 18 carbon atoms, a substituted or unsubstituted aromatic hydrocarbon group having from 6 to 18 carbon atoms, an ether group, an imino group, a carbonyl group, or a monovalent or polyvalent linking group comprising any of these groups bonding to each other in series; m2 indicates an integer of from 1 to 6; when m2 is 2 or more, $R^9$'s and $R^{10}$'s each may be the same or different.

25. A gas-barrier film produced by the method of claim 16.

* * * * *